(12) United States Patent
Jubien et al.

(10) Patent No.: US 6,868,162 B1
(45) Date of Patent: Mar. 15, 2005

(54) METHOD AND APPARATUS FOR AUTOMATIC VOLUME CONTROL IN AN AUDIO SYSTEM

(75) Inventors: Christopher Michael Jubien, Victoria (CA); Constantine Lakoumentas, Bothell, WA (US); Brian John Roden, Cobble Hill (CA); Dale John Shpak, Victoria (CA); Jeffrey William Sondermeyer, Bothell, WA (US)

(73) Assignee: Mackie Designs Inc., Woodinville, WA (US)

( * ) Notice: Subject to any disclaimer, the term of this patent is extended or adjusted under 35 U.S.C. 154(b) by 798 days.

(21) Appl. No.: 09/715,588

(22) Filed: Nov. 17, 2000

Related U.S. Application Data
(60) Provisional application No. 60/234,517, filed on Sep. 20, 2000.

(51) Int. Cl.[7] .............................................. H03G 3/00
(52) U.S. Cl. ...................................... 381/107; 381/108
(58) Field of Search ................................ 381/107, 108, 381/104, 57, 56

(56) References Cited

U.S. PATENT DOCUMENTS

| | | |
|---|---|---|
| 5,434,922 A | 7/1995 | Miller et al. |
| 5,450,494 A | 9/1995 | Okubo et al. |
| 5,615,270 A | 3/1997 | Miller et al. |
| 5,666,426 A * | 9/1997 | Helms ........................ 381/107 |
| 5,790,671 A * | 8/1998 | Cooper ........................ 381/107 |
| 5,844,992 A | 12/1998 | Boyer |
| 5,872,852 A | 2/1999 | Dougherty |
| 5,907,622 A | 5/1999 | Dougherty |
| 6,529,605 B1 * | 3/2003 | Christoph ..................... 381/57 |
| 6,584,201 B1 * | 6/2003 | Konstantinou et al. ..... 381/107 |

FOREIGN PATENT DOCUMENTS

JP 1-248799 4/1989

OTHER PUBLICATIONS

Symetrix—571 SPL Computer User's Guide, dated Mar. 1999.

* cited by examiner

*Primary Examiner*—Stella Woo
(74) *Attorney, Agent, or Firm*—Christensen O'Connor Johnson Kindness PLLC

(57) ABSTRACT

An audio system (100) is provided with improved adaptive filter (206) to automatically adjust signal gain depending on the ambient noise level. The original music signal passes through a normalized adaptive filter (206), and is subtracted from the ambient room signal detected by a microphone (120), resulting in an error signal that is an estimate of the ambient noise. The error signal is used to update a set of adaptation coefficients so that the normalized adaptive filter more accurately simulates the room transfer function, resulting in an better estimate of the ambient noise. The audio system (100) is calibrated automatically upon initial use to determine adaptation coefficients and noise threshold level to prevent runaway gain. System parameters are adjusted using a controller (124) with a user-friendly interface (400).

32 Claims, 6 Drawing Sheets

METHOD AND APPARATUS FOR AUTOMATIC VOLUME CONTROL IN AN AUDIO SYSTEM

This application claims benefit of U.S. Provisional 60/234,517 filed Sep. 20, 2000.

FIELD OF THE INVENTION

This invention generally relates to audio systems, and more specifically, to automatic volume control of sound by an audio system in response to ambient noise.

BACKGROUND OF THE INVENTION

When an audio system is used in an environment with a varying ambient noise level, it is often necessary to adjust the output volume of the audio system to overcome the ambient noise level. For example, when listening to music in a vehicle, it is necessary to turn up the volume when the vehicle is driving on a rough road, and turn down the volume when the vehicle comes to a stop. For a message announcement system in a transportation station, such as airport or train station, it is desirable to turn down the volume of loudspeakers during early morning hours, and turn up the volume during busy hours. Likewise, when listening to music or message broadcast in a factory environment, it is desirable to increase the loudspeaker volume when machinery is running, and decrease the volume when machinery is idle.

In a typical automatic volume control system, a music signal from a music source is broadcast via a loudspeaker, and a microphone is used to detect an ambient room signal which includes the music portion and the ambient noise portion. When the original music signal is subtracted from the ambient room signal detected by the microphone, the resulting error signal approximates the ambient noise. However, such a method of measuring and compensating for the ambient noise level is inaccurate because the music signal is modified by the room conditions. In a house or apartment, the room conditions may include room size, furniture arrangements, number of people in the room, etc. In a vehicle, the "room" conditions may include the size of vehicle, seat configurations, and number of people present in the vehicle, etc. In addition, other factors such as phase delay from the speaker to the microphone, frequency response of various components of the audio system, etc., also affect the actual sound signal received by the microphone. The effect of sound modification due to the various conditions and factors is called the room transfer function. To obtain better results, an adaptive filter is often used in typical audio systems to simulate the room transfer function. When the music signal is passed through the adaptive filter, the filtered signal approximates the modified music portion of the ambient room signal received by the microphone. By subtracting the filtered signal from the ambient room signal detected by the microphone, a better approximation of the ambient noise is obtained, and volume of the music signal is adjusted to compensate the ambient noise. However, known adaptive filters still fail to adequately compensate for ambient noise automatically under varying conditions and environments.

SUMMARY OF THE INVENTION

The present invention provides an audio system with an improved adaptive filter to automatically adjust signal gain depending on the ambient noise level. The original music signal passes through a normalized adaptive filter, and is subtracted from the ambient room signal detected by a microphone, resulting in an error signal that is an estimate of the ambient noise. The error signal is used to update a set of adaptation coefficients so that the normalized adaptive filter more accurately simulates the room transfer function, resulting in a better estimate of the ambient noise. An auto-calibration procedure is also provided to automatically calibrate the adaptive coefficients upon initial use and to determine a noise threshold to prevent runaway gain. In addition, a controller is provided with a user interface to allow convenient adjustment of system parameters.

An advantage of the present invention is that the music signal and ambient room signal are down-sampled prior to being processed by the normalized adaptive filter, thereby allowing the system to be used in larger room settings. Further, the improved normalized filter adapts quickly to room conditions automatically. Another advantage is that the auto-calibration procedure provides fast calibration of the adaptive filter coefficients when the system is used for the first time or when the room conditions have changed. In addition, the auto-calibration procedure automatically determines the noise threshold above which gain adjustment is applied to the music signal, so that there will be no runaway gain regardless of how the user configures the system parameters and regardless of the environment where the system is set up. Further, the use of a simple user interface allows the user to specify only a small number of parameters, such as the gain range and the noise threshold level, etc., so that the system can automatically adjust signal gain within preset limits to compensate for the noise level.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 1:
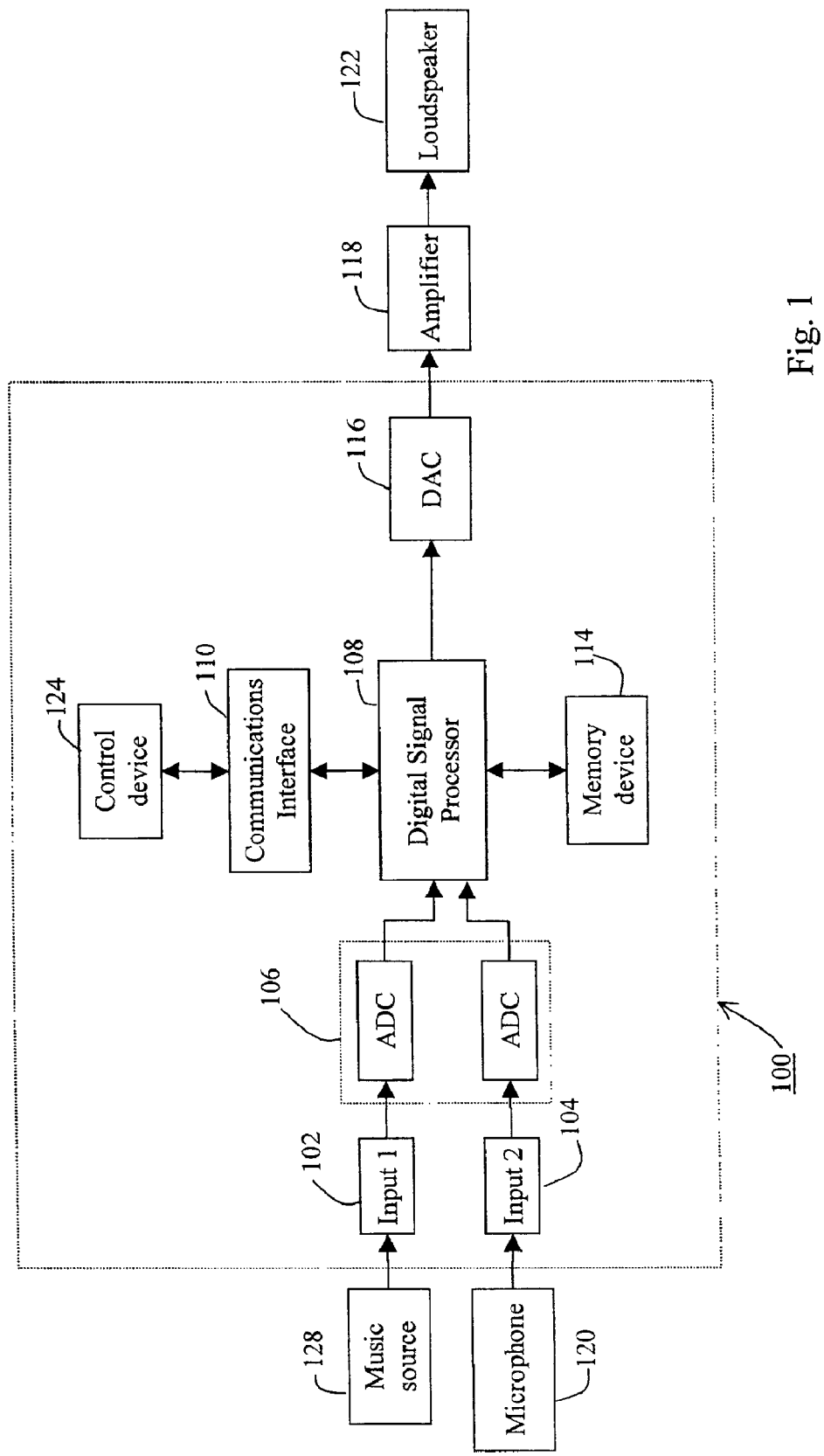
FIG. 1 is a block diagram of an audio system in accordance with the present invention.

An audio system 100 formed in accordance with the present invention is shown in FIG. 1. The audio system 100 is used to determine ambient noise level in a room and automatically adjusting the volume of a loudspeaker to broadcast sound at an appropriate output level to overcome the ambient noise. System 100 includes inputs 102 and 104, an analog-to-digital converter (ADC) 106, a digital signal processor (DSP) 108, and a digital-to-analog converter (DAC) 116. Input 102 may be an audio phone jack or other signal coupling device, and is coupled to a music source 128, such as a CD player, radio or public address system. It is understood that the invention is not limited to adjusting music volume, and can be applied to any sound source, such as human speech. Music source 128 generates a music signal that is broadcast by a loudspeaker 122 driven by an amplifier 118, which in turn is coupled to the output of DAC 116. A pre-amplifier (not shown) may be used to amplify the music signal from music source 128 prior to being sent to input 102. Input 104 also may be a phone jack or other signal coupling device, and is coupled to a microphone 120. Microphone 120 detects a total ambient room signal that includes the ambient noise and the music sound signal broadcast by loudspeaker 122. A microphone pre-amplifier (not shown) may also be used to amplify the ambient room signal prior to being sent to input 104. The analog signals from inputs 102 and 104 are sent to ADC 106 to obtain digital samples. The digital samples are processed by DSP 108, and then sent to DAC 116 to be converted into analog signals. The analog signals are sent to amplifier 118, which in turn drives loudspeaker 122.

System 100 also includes a communications interface 110 coupled to DSP 108 for interfacing a control device 124. Control device 124 may be a remote control or a handheld computer that provides a user interface to allow adjustment of system parameters, as described later in accordance with FIG. 4. Control device 124 allows a user to control the sensitivity and various threshold levels of system 100. DSP 108 is also connected to a memory device 114 to store parameters used by DSP 108. Memory device 114 may include volatile memory, such as RAM or EPROM, and/or non-volatile memory such as EEPROM. The non-volatile memory allows system parameters to be stored when the power is turned off.

In one embodiment of the present invention, audio system 100 may be a Mackie SP-DSP1 audio expansion card, and is used as an add-on card in a sound mixer/amplifier SP2400/1200 (not shown in the figures). Microphone 120 may be a RCF MT3100 omni-directional electret microphone. In most situations, any inexpensive low-impedance, omni-directional microphone can be used. When system 100 is installed in a smaller room, a directional microphone may be achieve better results. Microphone 120 should be placed near the ambient noise and away from the loudspeaker 122 to achieve the best performance. Any mechanical feedback (direct vibrations) from the loudspeaker to the microphone should be avoided. Controller device 124 can be a Palm Pilot handheld device or any compatible computing device.

Figure 2:
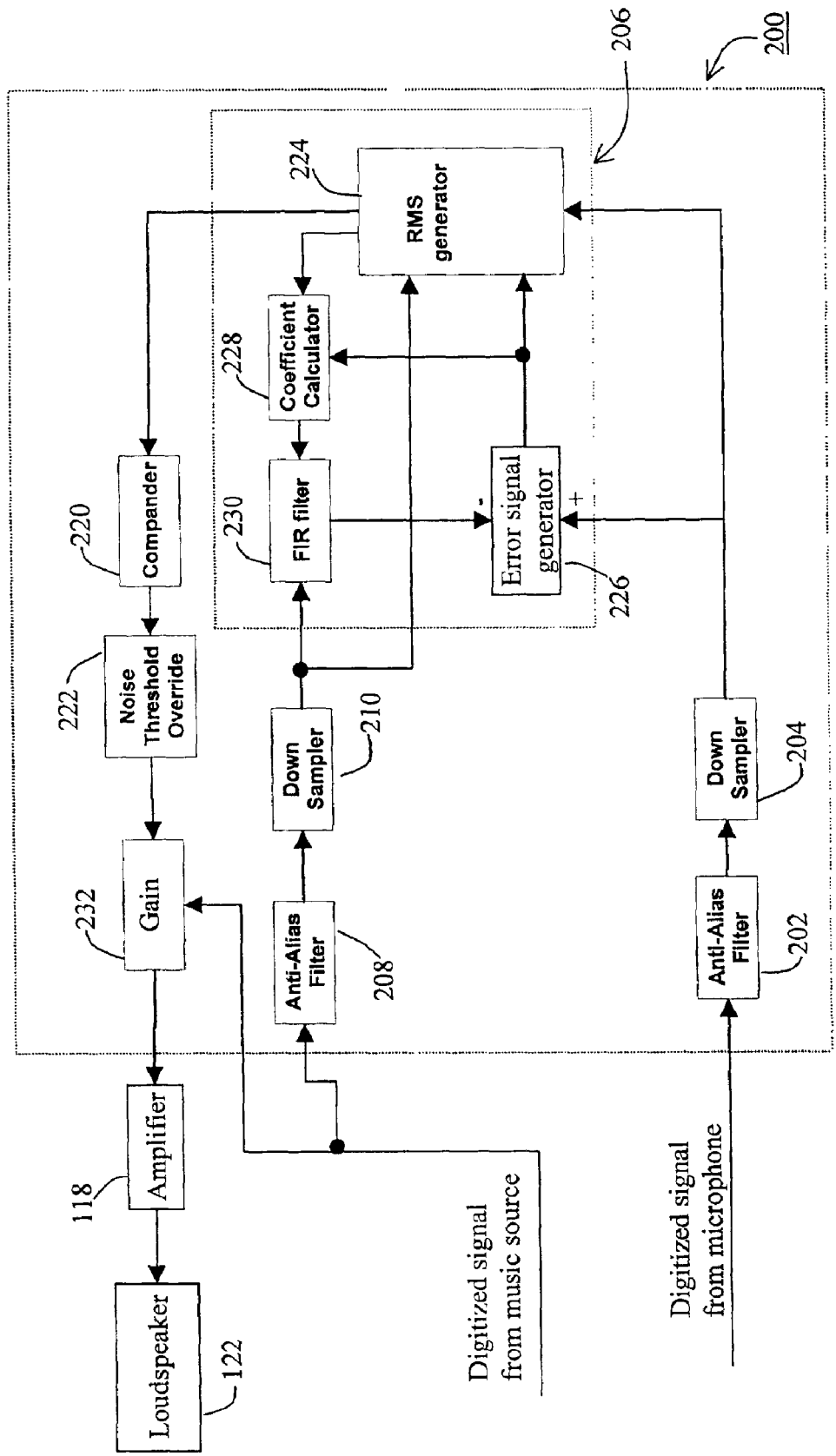
FIG. 2 is a block diagram of the software components of a gain computation procedure used by the audio system to automatically determine the gain necessary to overcome the ambient noise.

Referring to FIG. 2, DSP 108 performs a gain computation procedure 200 to process the input signal from music source 128 and microphone 120 to determine the appropriate gain to be applied the music signal to overcome the ambient noise. Each functional block in FIG. 2 corresponds to a portion of the software code that is executed by DSP 108 to implement gain computation procedure 200. Each connection line in FIG. 2 corresponds to data flow from one portion of the software code to another. It is understood by a person skilled in the art that each functional block can also be implemented using dedicated hardware.

Gain computation procedure 200 includes an adaptive filter 206 that adapts to the room conditions in real-time to accurately simulate the room transfer function. The music signal, after passing through adaptive filter 206, approximates the modified music portion of the ambient room signal detected by microphone 120. The modified music portion refers to the music signal modified by the room transfer function as determined by the adaptive filter 206. The adaptive filter 206 may be a normalized least mean square (nLMS) adaptive filter. Other adaptive filter algorithms, such as recursive least squares, QR decomposition least squares, least squares lattice, QR decomposition lattice or gradient adaptive lattice, etc, can also be used.

The ambient room signal detected by microphone 120 is passed through an anti-alias filter 202 before being down-sampled by down sampler 204 and passed on to the adaptive filter 206. The anti-alias filter 202 may be a 5-stage 10'-order Chebyshev filter (Direct Form II Biquad IIR filter section) having four filter coefficients per stage and one gain coefficient. The filtered signal is sent to a down sampler 204. Down sampling extends the effective finite impulse response (FIR) length used by adaptive filter 206, which provides better music signal cancellation in larger rooms having longer sound reflection paths. Down sampling also reduces memory and computation requirements, thus allowing a lower cost/lower capacity digital signal DSP to be used. In one embodiment of the present invention, the ADC 106 samples the signal from inputs 102 and 104 at a rate of 44,100 Hz, and then the digitized samples are down-sampled to 5,512.5 Hz. The down-sampled signals are sent to an error signal generator 226 and a root-mean-square (RMS) generator 224 within the adaptive filter 206 for further processing.

The music signal from music source 128, after being digitized by the ADC 106, is passed through a low pass anti-alias filter 208, and then down-sampled by a down sampler 210. The signal output from down sampler 210 is sent to RMS generator 224 of the adaptive filter to calculate the room-mean-square (RMS) levels of these signals. The down sampled signal from down sampler 210 is also sent to a finite impulse response (FIR) filter 230. FIR filter 230 simulates the room transfer function, and the output of FIR filter 230 approximates the modified music portion of the ambient room signal received by microphone 120.

RMS generator 224 calculates the RMS levels for the down-sampled music signal from down sampler 210, the ambient room signal from down sampler 204, and the error signal from error signal generator 226. In this regard, each down-sampled signal is squared and summed with the previous squared signal. Every m=22 samples, this sum of squares is square rooted to produce one RMS value. Then every 1.02 seconds (5632 samples or 256 RMS values later), these RMS values are filtered or by a 256-point raised cosine window function to compute a "long term RMS average." This window function is actually the RMS Average Time which, in the embodiment is fixed at 1.02 seconds, is the average of the previous 256 RMS values. This effectively smoothes the response of the RMS generator by a predetermined delay, which is approximately half of the duration of the window. The window function also suppresses the impulse response to zero by the end of the window. For example, when a door is slammed, a large impulse signal will occur in the music signal. The window function will remove the impulse at the end of the duration of the window.

The outputs of FIR filter 230 and down sampler 204 are sent to error signal generator 226. The signals from down sampler 204 represent a down-sampled version of the sum of the ambient noise and the modified music signal. Error signal generator 226 takes the output of down sampler 204, and subtracts the output of FIR filter 230, which is an approximate of the music signal after being modified by the room transfer function. The output of error signal generator 226, called the error signal, is thus an approximation of the ambient noise signal.

The FIR filter 230 may be a transversal N-point FIR filter, with an input buffer capable of storing N audio samples. N may be equal to 1536, each sample may be 24 bit in length, and DSP 108 may be a 32-bit floating point processor. Because the input buffering is done as a background process, the input buffer should have sufficient size to store the input data while the buffered data is processed in the background. The output of FIR filter 230 can be written as:

$$y(n) = \sum_{i=0}^{N-1} w_i(n) * u(n-i) \quad \text{(Equ. 1)}$$

where y(n) is the n-th point FIR output, $w_i$(n) is the n-th point adaptation coefficient, and u(n−i) is the (n−i)th FIR input, which is the down-sampled music signal. The FIR length may be 1536 taps, which corresponds to an FIR length of 278.6 ms when the down-sampled rate is approximately 5,512.5 Hz. Since the speed of sound is aproximately 1 ft/ms, this FIR filter can provide proper cancellation of a music path up to approximately 280 feet. Of course, the present invention can provide cancellation of shorter music paths. However, longer music paths will require a larger FIR filter; i.e., more data memory for the FIR taps.

The adaptation coefficients of FIR filter 230 are updated continuously to adapt to changes in room conditions and other factors that affect the music signal received by microphone 120. The adaptation coefficients are updated if a normalization energy is greater than zero and the error signal is above a predetermined threshold. The normalization energy is the sum of squares of the music signal. For example, the normalization energy may be a sum of 256 squares of the music signal samples, and the predetermined threshold may be 30 dB below the RMS music signal level. By using this threshold, the adaptation coefficients are not updated when the update does not significantly improve FIR filter 230 in simulating the room transfer function. When updating the adaptation coefficients, coefficient calculator 228 receives the outputs of RMS generator 206 and error signal generator 226, and calculates the adaptation coefficients according to the following formula:

$$Wi(n+1) = Wi(n) + \frac{\min[\text{beta}, e(n)] * u(n-i)}{\text{epsilon} * E(n)} \quad \text{(Equ. 2)}$$

where "i" ranges from 0 to n−1, "$W_i$(n)" is the i-th adaptation coefficient for the n-th audio sample, "e(n)" is the n-th error signal generated by error signal generator 226, "u(n−i)" is the (n−i)th FIR input data, "beta" is an adaptation rate, "epsilon" is a stability coefficient, and "E(n)" is the normalization energy. The "beta" variable is used as a clip to limit the effect of the error signal e(n). This results in stability of the algorithm when the error is large, but also allows faster adaptation when the error is smaller.

Preferably, adaptive filter 206 adapts to a room condition within a second to a few minutes. The use of an error threshold adds stability to the algorithm when the input signal is relatively small compared to normal music signal levels. In addition, the error threshold prevents the adaptive coefficient from being updated which prevents gain increases when the music signal contains content that is relatively quiet, such as during the silence between music programs. Also, employing the 256-point cosine window function discussed above reduces the impact of low frequency room energy variations caused by the music broadcast into the room.

RMS generator 224 also computes the RMS values of the down-sampled ambient room signals detected by microphone 120. The RMS values of the down-sampled ambient room signal, the music signal, and the error signal are sent to a compander 220 to determine the amount of gain to be applied to the music signal. The RMS levels may be converted to decibels (dB) before being sent to compander 220. Compander 220 controls the parameter Current Gain (CG), which represents the gain applied to the music signal by gain block 232, using user-defined parameters "Noise Threshold," "Noise Range," "Minimum Gain," "Gain Range," "Attack Time," "Release Time," and the RMS levels for the music signal and ambient room signal, etc. Thus, compander 220 controls the rate at which the gain is increased or decreased. Compander 220 uses the following formula to compute a Target Gain (TG):

$$TG=MinG+(GR*\min[1.0, (e-NT)/(NR)]) \quad \text{(Equ. 3)}$$

where MinG represents the "Minimum Gain," GR represents the "Gain Range," "e" represents the "RMS error signal," NT represents the "Noise Threshold," and NR represents the "Noise Range." The above parameters are specified in decibels. The min[ ] function in Equation 3 clips the ratio of ((e−NT)/NR) at 1.0, so that the Target Gain is never greater than (MinG+GR). The Attack Time and Release Time parameters determine the rate of adjustment to the Current Gain in order to reach the Target Gain according to the following formula:

If $TG>CG$, then $CG=CG+(40\ dB*8/44100)$ 1 (Attack Time), (Equ. 4)

else $CG=CG-(40\ dB*8/44100)/$(Release Time).

The Target Gain and Current Gain are specified in decibels, and the Attack Time and Release Time are specified in seconds. Different Attack Time and Release Time may be used for different environments or locations. For example, setting a longer Attack Time and a shorter Release Time allows compander 220 to increase the gain level slowly but decrease the gain quickly. This allows compander 220 to track ambient noise fairly closely when noise level drops while ignoring sudden loud events, such as door slams, yells, or dropped dish trays, etc. A bypass feature is provided to disable the automatic gain adjustment routines and set the gain to be 0 dB.

The output of compander 220 is the signal gain applied to the music signal by gain block 232. Gain block 232 applies the gain calculated by compander 220 to the music signal. Between compander 220 and gain block 232 is a noise threshold override block 222 that determines if runaway gain might occur. Runaway gain is the level of gain that will cause a positive feedback loop in system 100 such that when the music signal level increases, the ambient noise determined by the system also increases, which in turn results in more gain increase for the music signal. Such runaway gain may occur when the user sets the system parameters improperly, either intentionally or unintentionally. A Noise Threshold Override parameter is calculated using the following formula:

Noise Threshold Override=max [(GR/max (CR, 1.0)+MaxG+max (CoG, CI)+CAL), NT] (Equ. 5)

where GR represents the "Gain Range," CR represents the "Compression Ratio" (Gain Range/Noise Range), MaxG represents the "Maximum Gain" (Minimum Gain+Gain Range), CoG represents a "Compander Gate" parameter, CI represents the "Compander Input" (RMS level of the music signal), CAL represents a calibration value described below, and NT represents the user-defined Noise Threshold. Compander Gate is a user-defined parameter used to prevent the Noise Threshold Override from becoming excessively small when the music signal becomes small, and has a default value of −20 dB.

Noise Threshold Override is substituted for the user-defined Noise Threshold whenever Noise Threshold Override is greater than the user-defined Noise Threshold. When the CAL value is set properly (as described below), the actual noise threshold used by system 100 is raised above the user-determined value for Noise Threshold if the parameters are set in a way such that runaway gain may occur. For example, if the user sets NT=−50 dB, and the parameters are such that runaway gain will occur, then NT will be raised above −50 dB to a level determined according to Equation 5. In Equation 5, the music signal RMS level is taken into consideration because the music signal can be interpreted as part of the ambient noise when runaway gain occurs. Gain block 232 applies the gain determined by compander 220 only if the error signal RMS level (which is an estimate of the ambient noise level) is greater than the Noise Threshold Override or the user-defined Noise Threshold, whichever is greater. Otherwise, if the error signal RMS level is smaller than the Noise Threshold Override or the user-defined Noise Threshold, whichever is greater, then a gain level equal to "minimum gain" is applied to the music signal.

When audio system 100 is first set up in a room or a vehicle, the user calibrates the system by specifying the maximum gain that can be applied to the music signal and playing some typical music samples. The user then initiates an auto-calibration procedure to calculate an initial set of adaptation coefficients and determine the Noise Threshold Override value. Coefficient calculator 228 then adjusts the adaptation coefficients of FIR filter 230 according to Equation 2. During calibration, it is desirable to have a minimum amount of room noise so that system 100 can determine the progress of simulating the room transfer function. System 100 continues to monitor the noise level and adjusts the FIR filter adaptation coefficients while progress is being made toward simulating the room transfer function. System 100 determines whether progress is made toward simulating the room transfer function by determining whether the CAL value gets smaller. Once the progress towards the room transfer function has slowed significantly, the Noise Threshold Override parameter value is computed. The FIR filter adaptation coefficients, the Noise Threshold Override value, and the CAL value are then stored in memory device 114. Whenever system 100 is reset (such as after power on/off) or when the auto-calibration procedure is invoked, the adaptation coefficients, the Noise Threshold Override value, and the CAL value are restored from memory device 114. This allows compander 220 to prevent runaway gain upon reset of system 100 and during normal operations. The adaptation coefficients are then updated continuously according to Equation 2 whenever room conditions change.

Some of the functional blocks (software code segments) described above may operate at a full sample rate of 44,100 Hz and some may operate at a down-sampled rate of 5512.5 Hz. Examples of full sample rate functions may include the audio mixer for mixing the multiple channels, the down sample filters, and the buffers used to obtain audio at the down-sampled rate. Down-sampled functions are all executed as a background process at a slower rate. The nLMS adaptive filter 206 (including the RMS generator 224) and compander 220 functions may operate at the down-sampled rate.

Figure 3:
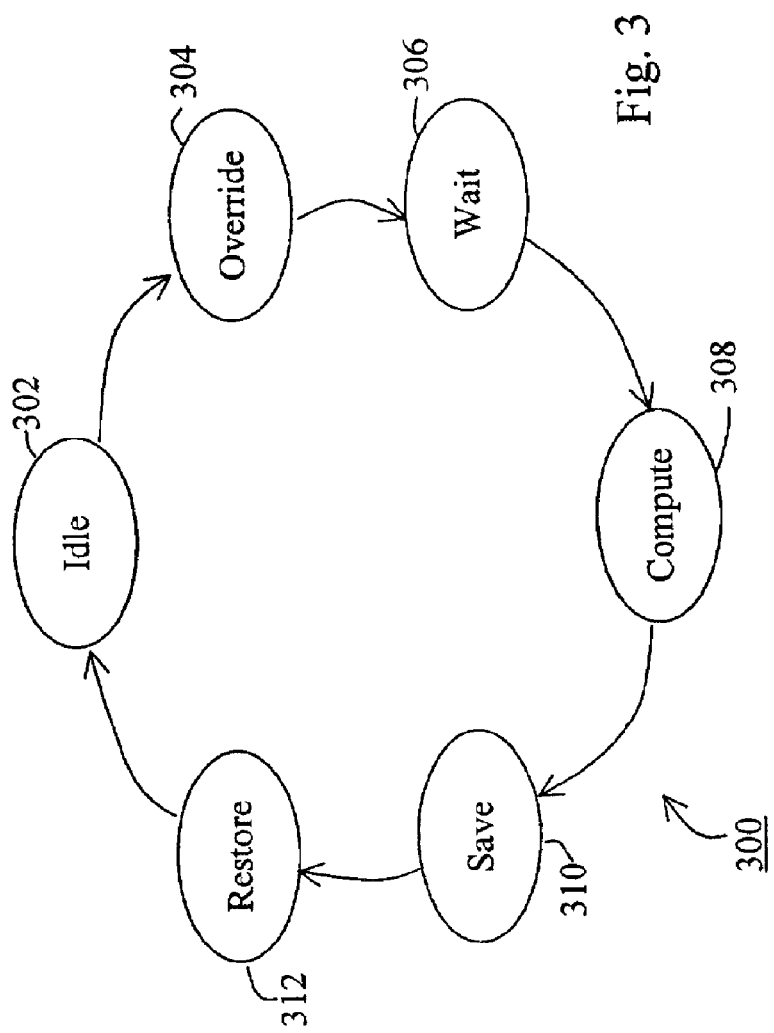
FIG. 3 is a state machine diagram of an auto-calibration procedure used to determine a noise threshold to prevent runaway gain.

Referring to FIG. 3, the auto-calibration procedure 300 is shown in more detail. The auto-calibration procedure 300 has 6 states: Idle state 302, Override state 304, Wait state 306, Compute state 308, Save state 310, and Restore state 312. Idle state 302 is the normal state of the system 100 when not calibrating. Override state 304 saves and overrides the current user-defined parameters with calibration parameters that have been optimized for best performance during a calibration sequence. These parameters are optimized to give the fastest adaptation with the rat least amount of variation in the adaptation results. System 100 enters this state when the user initiates an auto calibration. Once the user-defined parameters have been set up properly for calibration, the system enters Wait state 306.

Wait state 306 is a timed waiting period during which the system 100 monitors the adaptation to determine whether progress is being made towards the actual room transfer function. As long as the rejection continues to improve (better approximation of the actual room transfer function by the adaptive filter), the timer will be reset to a default period, preferably 90 seconds. If no improvement has been made during the default period, then the algorithm is assumed to have adapted as best it can and the system will switch to Compute state 308.

Compute state 308 computes and automatically adjusts the calibration (CAL) value. This value is computed by using a portion of the "rejection" computed from the microphone signal (output of microphone 120) and the error signal (output of error signal generator 226). If the noise in the room is at a minimum during the calibration process, then the microphone signal represents the music signal in the room, and the error signal represents the portion of music signal that the algorithm was unable to cancel out of the microphone signal. The difference between these two signal levels is an approximation of the "rejection" capability of the algorithm. The estimated rejection value is calculated from the following:

$$\text{Estimated rejection}=0.6*(\text{microphone signal } RMS-\text{error signal } RMS) -3.0 \text{ Headroom } RMS \qquad \text{(Equ. 6)}$$

From this estimated rejection, the CAL value is updated according to the formula:

$$CAL=(\text{error signal } RMS+\text{Headroom } RMS)-\text{music signal } RMS \qquad \text{(Equ. 7)}$$

After computing and adjusting the CAL value, the system goes to Save state 310.

Save state 310 saves the parameter values and the FIR filter adaptation coefficients (determined in Compute state 308) in memory device 114. This allows system 100 to operate properly upon reset or power-up, since these values are recalled from memory device 114 automatically upon reset. After these values have been saved in memory device 114, the system enters Restore state 312. Restore state 312 restores all the user-defined parameters that were overridden in Override state 304. After the user-defined parameters are restored, the system goes back to Idle state 302.

Figure 4:
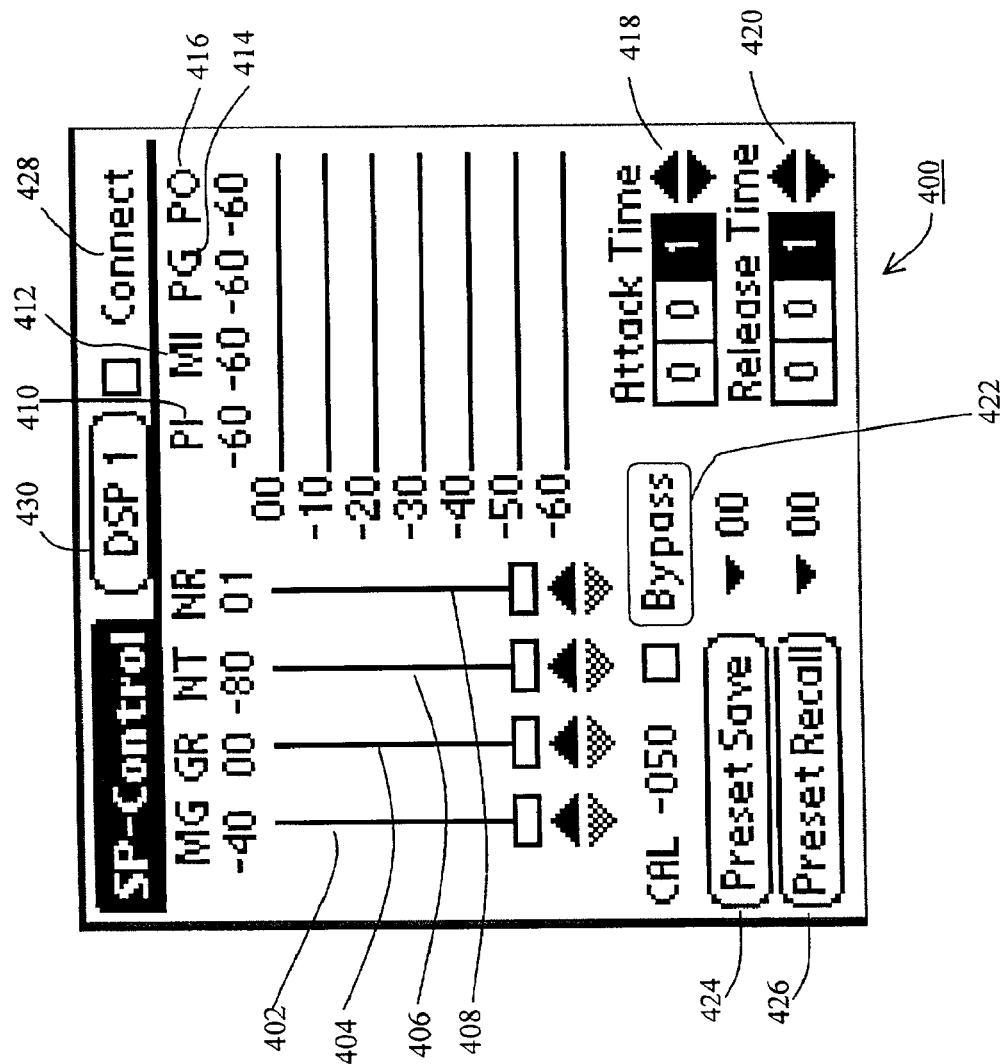
FIG. 4 is a user interface of a control device used to adjust system parameters.

Referring to FIG. 4, a user interface 400 for control device 124 includes slide controls 402, 404, 406, and 408 for adjusting the parameters "Minimum Gain (MG)," "Gain Range (GR)," "Noise Threshold (NT)," and "Noise Range (NR)" referred to above. User interface 400 also provides "control buttons" 418 and 420 for adjusting the "Attack Time" and "Release Time".

Table 1 below shows some preferred ranges for the parameters MG, GR, NT, NR, and Attack/Release time according to one embodiment of the present invention. Minimum Gain ranges from −40 dB to 0 dB, with a default value of 40 dB. The SP-DSP1 card of the audio system 100 only attenuates signals entering input 102, so system 100 does not produce gain from input to output. By specifying the parameters Minimum Gain and Gain Range, a music signal gain window is established such that the music signal levels remain within the windowed gain range. For example, if the user intends the music levels to operate in a range of +10 dB around −15 dB down from input level, then MG=−25 dB and GR=20 dB.

TABLE 1

|  | MG (dB) Minimum Gain | GR (dB) Gain Range | NT (dB) Noise Threshold | NR (dB) Noise Range | Attack/ Release Time (sec) |
| --- | --- | --- | --- | --- | --- |
| Minimum | −40 | 0 | −80 | 1 | 1 |
| Maximum | 0 | 40 | 0 | 60 | 300 |
| Default | −40 | 40 | −40 | 40 | 1 |

When the parameter Minimum Gain is specified using slide control 402, slide control 404 for parameter Gain Range is re-scaled so that the maximum gain (from input to output) is never greater than 0 dB. For example, if MG=−10 dB, then GR≦10 dB. The maximum gain is computed by adding the Minimum Gain and the Gain Range, i.e., Maximum Gain=Minimum Gain+Gain Range. Preferably, the user sets the desired Minimum Gain of the music and leaves the Gain Range at the default re-scaled setting.

The parameter Noise Threshold sets the "trigger" of gain computation procedure 200. The gain level of the music signal is adjusted by the gain computation procedure 200 only when the noise level is above the Noise Threshold value. By specifying the Noise Threshold value, slide control 406 determines the "noise sensitivity" of gain computation procedure 200. The lower the Noise Threshold (the value being more negative), the more sensitive the music signal gain adjustments are to noise level variations. A parameter Noise Window specifies the range of noise level that will affect the music signal gain level, and is determined by:

$$\text{Noise Window} = \text{Noise Threshold} + \text{Noise Range}. \quad \text{(Equ. 8)}$$

When the noise level is within the Noise Window, the music signal gain level will be affected by gain computation procedure 200.

The parameters used by system 100 are all expressed in dB relative to a unity point of 0 dB. The unity point is arbitrarily defined as 17 dB below the full scale I, signal (1.8V RMS) so that a 0 dB measurement represents −17 dBFS, which is 254 mV (1.8*100 (−17/20)). Because many parameters are specified in RMS values and not peak values, providing a 17 dB headroom will prevent the system from inadvertently clipping the signals near unity point. Thus, when a user defines Noise Threshold to be equal to −80 dB, the noise threshold level is actually −97 dBFS (calculated from 1.8V*10' (−97/20)) relative to 1.8V RMS. Of course, the unity point can be set at a different level below the full-scale signal.

Figure 5:
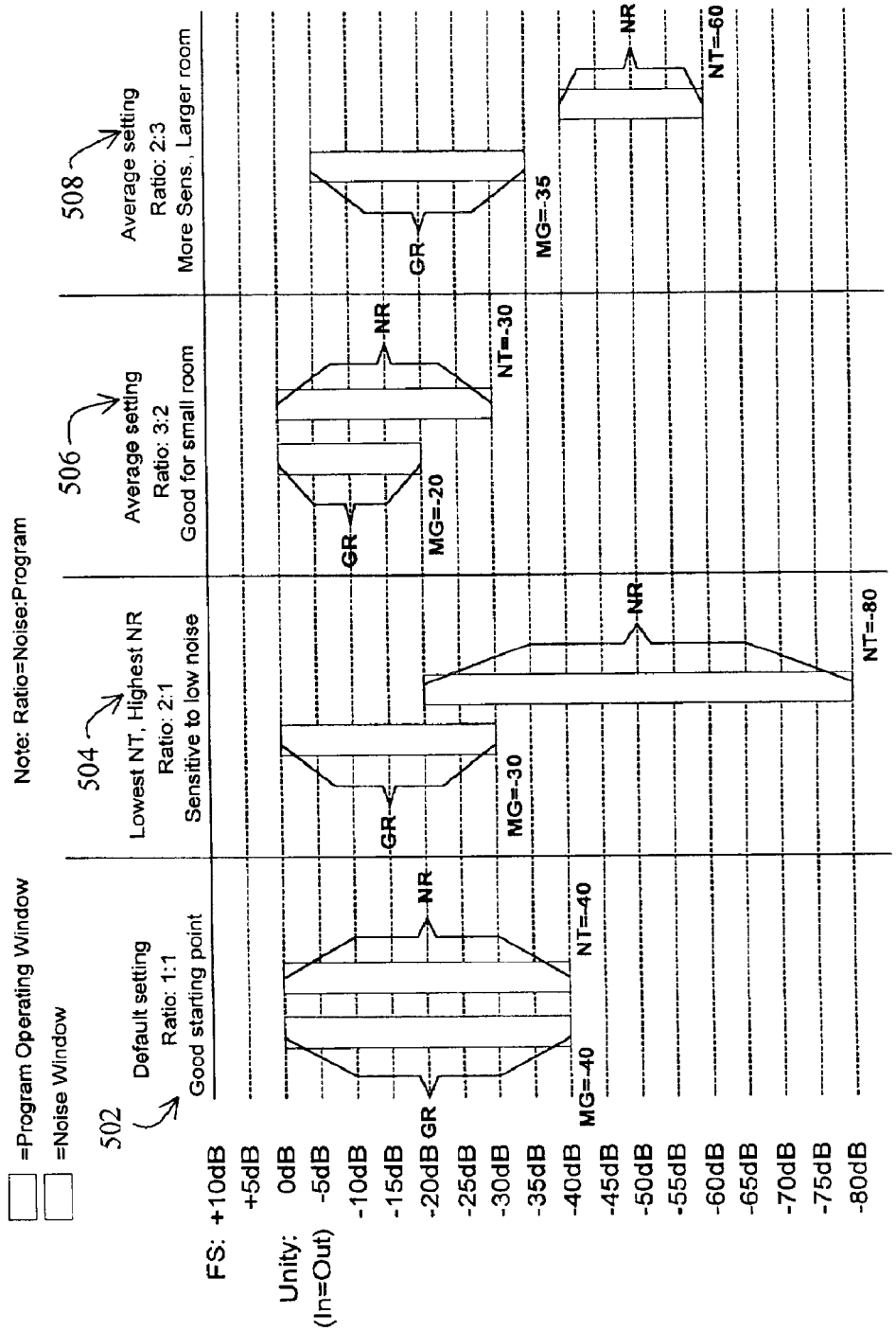
FIG. 5 is a chart showing gain and noise ranges corresponding to different system settings.

Referring to FIG. 5, different user-defined settings with different gain ranges and noise ranges are shown. Setting 502 is the default setting in which the noise range and the gain range are both between 40 dB to 0 dB. The ratio between noise and gain ranges is 1:1, thus a 1 dB noise level change will result in a 1 dB gain level change. On the other hand, setting 504 provides high sensitivity to low noise. The gain range is between −30 dB and 0 dB. The noise range is between −80 dB and −20 dB. The ratio between noise and gain ranges is 2:1, thus for every 2 dB of noise level change, the gain level will correspondingly change 1 dB. As yet another example, setting 506 is suitable for small rooms. The gain range is between −20 dB to 0 dB, and the noise range is between −30 dB and 0 dB. Accordingly, the ratio between noise and gain ranges is 3:2, or 2 dB change in gain level for 3 dB change in noise. Finally, setting 508 is suitable for larger rooms. The gain range is between −35 dB and −5 dB, and the noise range is between −60 dB and 40 dB. Accordingly, the ratio between noise and gain ranges is 2:3 or 3 dB change in gain level and 2 dB change in noise. By adjusting the signal gain window (using MG and GR) and the noise window (using NT and NR), the user can configure the system to be sensitive to small noise changes or insensitive to large noise changes, or in between.

Returning to FIG. 4, user interface 400 allows the user to adjust the signal gain and noise windows described above using meters 402, 404, 406 and 408. In addition, user interface 400 provides four meters 410, 412, 414, and 416 for the user to monitor parameter levels during setup and normal operations. The Program Input (PI) meter 410 displays the RMS signal level of input 102 (range from −60 to 0 dB). During setup before auto-calibration procedure 300 is initiated, the user needs to ensure that the input music signal has sufficient signal level by monitoring Program Input meter 410. Preferably, the input level should be between 0 and −110 dB during the loudest portions of the music signal.

Microphone Input (MI) meter 412 displays the signal level of input 104, which is the microphone pre-amplifier output level. During setup before auto-calibration procedure 300 is initiated, the user needs to ensure that the signal level of input 104 is between 0 and −100 dB for the loudest noise in addition to the loudest music signal expected. Preferably, an ambient microphone trim potentiometer is provided for adjusting the microphone output level. In one embodiment, system 100 does not have a microphone preamplifier, thus it is essential that input 104 receives a line-level signal (1.8V RMS Full-scale).

Program Gain (PG) meter 414 represents the gain (−60 dB to 0 dB) that system 100 applies to the music signal as determined by gain computation procedure 200. Program Output (PO) meter 416 represents the signal level received by DAC 116 (60 dB to 0 dB) from the DSP 108. The relationship between PI, PG, and PO is: Program Output level=Program Input level+Program Gain (in dB).

A Bypass button 422 is also provided on user interface 400. When Bypass button 422 is selected, system 100 enters a "Bypass state," and gain computation procedure 200 is bypassed so that no gain is applied to the music signal. A method of setting the proper input level for microphone 120 is to select Bypass button 422, then while playing a typical music program, adjust the microphone preamplifier trim potentiometer until the Microphone Input meter 412 is within 0 to −10 dB. This allows the user to adjust the microphone input level while the microphone is receiving both the music signal and the ambient noise so that the system does not inadvertently clip the input of microphone 120 during calibration. Clipping the input level of music signal or microphone signal will produce erratic controller behavior and should be avoided.

User interface 400 further includes control buttons 418 and 420 for adjusting the rate of gain increase or decrease. Control button 418 adjusts the Attack Time parameter, which is the time (in seconds) for the Program Gain to increase by 40 dB. Control button 420 adjusts the Release Time parameter, which is the time it takes the Program Gain to decrease by 40 dB. The combination of these two parameters allows the user to adjust the sensitivity of system 100 to the appearance or disappearance of noise, thereby providing a relatively stable Program Gain over time. For example, with long attack and release times, the Program Output level will change rather moderately in response to a sudden noise level shift. The Attack Time may be set to 20 seconds and the Release Time may be set to 20 seconds. Under such settings, the Program Output level will not respond to impulsive noise level changes, but would still respond to gradual noise level changes. In a factory environment where there are numerous pages and break time buzzers, setting the Attack Time and Release Time in the order of minutes will allow the Program Output level to change only when there is an average long-term noise level change. In some situations, it is preferable to have a long Attack Time and a short Release Time, or visa versa. For example, in a factory with background music, the machines may be turned on sequentially over a rather long period of time in the morning, but are turned off together in the evening. In such situations, it is preferable to have a long Attack Time to allow the Program Output level to increase slowly as the machines are turned on in sequence, and to have a short Release Time so that the Program Output level can decrease rapidly when the noise level fades.

User interface 400 also provides a "Preset Save" button 424 and a "Preset Recall" button 426 for saving and recalling preset parameter values. These preset parameter values are stored in memory device 114. Preset parameters can include the Minimum Gain, Gain Range, Noise Threshold, Noise Range, Attack Time, and Release Time parameters. The user parameters for GC "Compander Gate" and "RMS Range Time" (window function) may also be stored in memory device 114. These parameters may be set at their default values of, for example, −20 dB and 1.02 seconds respectively.

User interface 400 also includes a "Connect" button 428 to allow the user to indicate that control device 124 is to be connected to digital signal DSP 108 via communications interface 110. When Connect button 428 is selected, parameters that are recalled at power up are displayed. Preferably, upon power up, the system enters the state that was last stored in memory device 114, and the calibration (CAL) value is recalled from memory device 114. Additionally, the preset parameter values that were saved when control device 124 was last connected to DSP 108 are also recalled from memory device 114. The set of preset parameter values that were last recalled before system 100 was turned off will be displayed on user interface 400. A "DSP n" (where n=1 or 2) button 430 is provided to allow the user to toggle between different digital signal processors. For example, the mixer/amplifier SP2400/1200 can support two SP-DSP1 cards, one for each channel, and each having its own digital signal processor. The button will display "DSP 2" when the second digital signal processor is being configured. The "DSP n" button 430 allows the user to control the parameter settings of each card independently.

Figure 6:
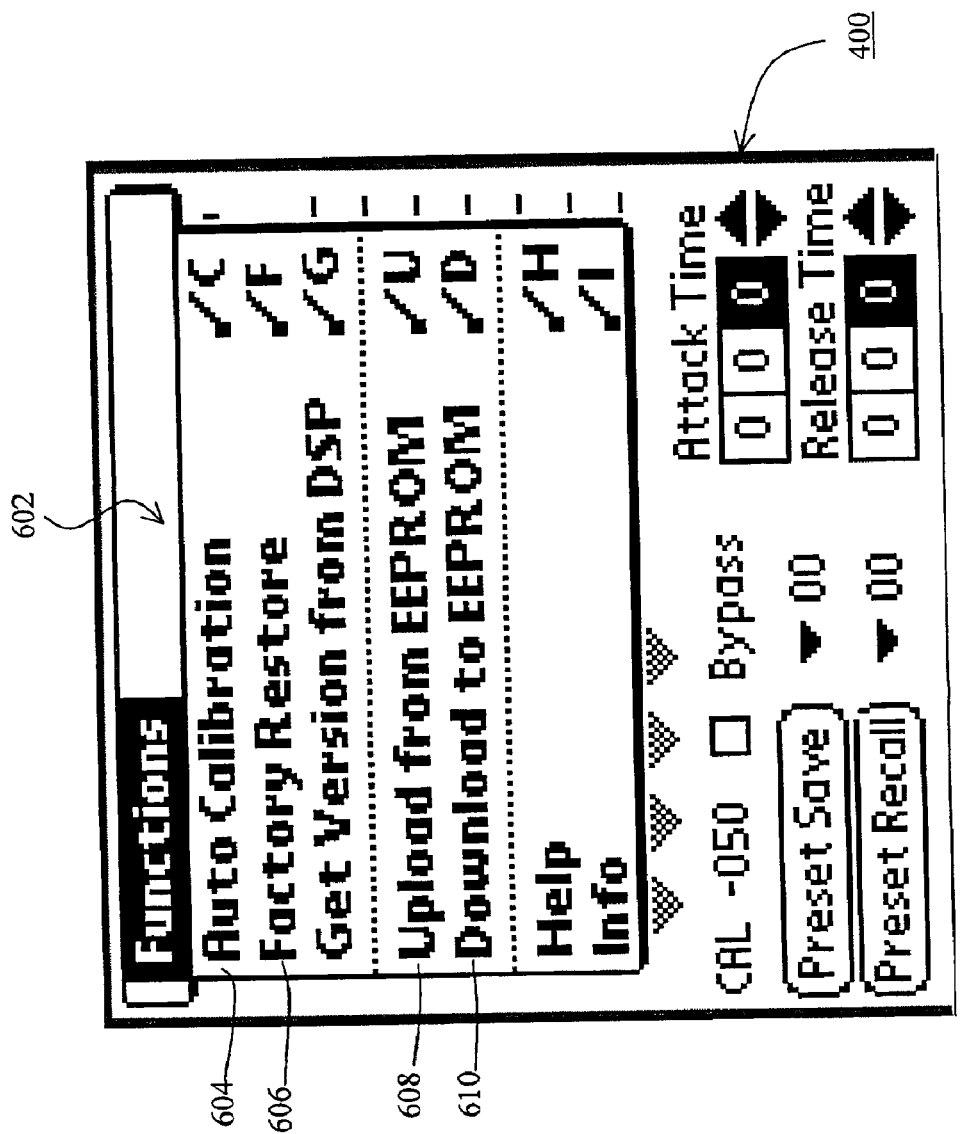
FIG. 6 is a pull-down menu of the user interface shown in FIG. 4 that lists system functions that may be initiated by the user.

User interface 400 also provides a drop-down menu for selecting a list of functions as shown in FIG. 6. An "Auto Calibration" function 604 is provided to initiate auto-calibration procedure 300 to automatically adapt system 100 to the room acoustics. A "Factory Restore" function 606 is provided to restore all parameters to preset default values. An "Upload from EEPROM" function 608 is provided to allow the parameter values stored in memory device 114 to be uploaded to control device 124. A "Download to EEPROM" function 610 is provided to allow the parameter values stored in control device 124 to be downloaded to memory device 114. The functions 608 and 610 are useful when the user wants to transfer the parameter values of one SP-DSP1 card to another card.

While a preferred embodiment of the present invention has been illustrated and described, it will be appreciated that various changes can be made therein without departing from the spirit and scope of the invention.

The embodiments of the invention in which an exclusive property or privilege is claimed are defined as follows:

1. An apparatus for controlling a gain of an audio signal broadcast by a loudspeaker into a room having ambient noise, comprising:

a first input for receiving the audio signal;

a second input for receiving an ambient room signal detected by a microphone, the ambient room signal having a noise portion representing the ambient noise and an audio portion representing the audio signal;

an adaptive filter for adaptively filtering the audio signal to generate a filtered signal that approximates the audio portion of the ambient room signal, the adaptive filter having a plurality of adaptation coefficients that are modified according to a predetermined formula having a threshold for limiting the rate of variation of the adaptation coefficients;

an error signal generator for subtracting the filtered signal from the ambient room signal to generate an error signal;

a compander for adjusting the rain of the audio signal responsive of the error signal to compensate for the ambient noise;

a down-sampler for sampling the audio signal at a sample rate lower than the highest frequency component of the audio signal, thereby Generating a down-sampled audio signal, and wherein said adaptive filter adaptively filters the down-sampled audio signal to generate the filtered signal; and wherein the adaptation coefficients are updated according to the formula $$Wi(n+1) = Wi(n) + \frac{\min[\text{beta}, e(n)] * u(n-i)}{\text{epsilon} * E(n)},$$

where $W_i(n)$ is representative of the i-th adaptation coefficient for the n-th audio sample, $e(n)$ is representative of the error signal, $u(n-i)$ is representative of the (n−i)th sample of the down-sampled audio signal, $E(n)$ is representative of the energy level of the audio signal, beta is the threshold value, and epsilon is a stability coefficient.

2. The apparatus of claim 1, wherein $E(n)$ is calculated by generating a series of root-mean-square values of audio signal samples, and then filtering the series of root-mean-square values with a window function to generate a long term root-mean-square average to reduce the effect of sudden amplitude increase in the audio signal.

3. An apparatus for controlling a gain of an audio signal broadcast by a loudspeaker into a room having ambient noise, comprising:

a first input for receiving the audio signal;

a second input for receiving an ambient room signal detected by a microphone, the ambient room signal having a noise portion representing the ambient noise and an audio portion representing the audio signal;

an adaptive filter for adaptively filtering the audio signal to generate a filtered signal that approximates the audio portion of the ambient room signal, the adaptive filter having a plurality of adaptation coefficients that are modified according to a predetermined formula having a threshold for limiting the rate of variation of the adaptation coefficients;

an error signal generator for subtracting the filtered signal from the ambient room signal to generate an error signal;

a compander for adjusting the gain of the audio signal responsive of the error signal to compensate for the ambient noise; and wherein the compander determines a target gain level TG for the gain of the audio signal according to the formula $$TG=MinG+(GR*\min [1.0, (e-NT)/NR]),$$

where MinG is representative of a minimum gain level, GR is representative of a gain range, e is representative of the error signal level, NT is representative of a noise threshold, and NR is representative of a noise range level.

4. The apparatus of claim 3, wherein the minimum gain level is approximately between −40 dB and 0 dB.

5. The apparatus of claim 3, wherein the gain range is approximately between 0 dB and 40 dB.

6. The apparatus of claim 3, wherein the noise threshold is approximately between −80 dB and 0 dB.

7. The apparatus of claim 3, wherein the noise range is approximately between 1 dB and 60 dB.

8. The apparatus of claim 3, wherein the compander adjusts the current gain applied to the music signal by increasing the current gain if the target gain is greater than the current gain.

9. The apparatus of claim 8, wherein the rate of increase in the current gain is determined according to the formula $$\text{current gain}=\text{current gain}+a1/(\text{Attack Time}),$$

where a1 is a predetermined constant, and Attack Time represents the amount of time for the current gain to increase by 40 dB.

10. The apparatus of claim 3, wherein the compander adjusts the current gain applied to the music signal by decreasing the current gain if the target gain is less than the current gain.

11. The apparatus of claim 10, wherein the rate of decrease in the current gain is responsive to a user-defined parameter Release Time and determined according to the formula $$\text{current gain}=\text{current gain}-a2/(\text{Release Time}),$$

where a2 is a predetermined constant, and Release Time represents the amount of time for the current gain to decrease by 40 dB.

12. An apparatus for controlling a gain of an audio signal broadcast by a loudspeaker into a room having ambient noise, comprising:

a first input for receiving the audio signal;

a second input for receiving an ambient room signal detected by a microphone, the ambient room signal having a noise portion representing the ambient noise and an audio portion representing the audio signal;

an adaptive filter for adaptively filtering the audio signal to generate a filtered signal that approximates the audio portion of the ambient room signal, the adaptive filter having a plurality of adaptation coefficients that are modified according to a predetermined formula having a threshold for limiting the rate of variation of the adaptation coefficients;

an error signal generator for subtracting the filtered signal from the ambient room signal to generate an error signal;

a compander for adjusting the gain of the audio signal responsive of the error signal to compensate for the ambient noise;

a non-volatile memory device for storing parameters used by the adaptive filter; and wherein the adaptive coefficients are initially determined according to a calibration procedure having an Override state that saves a set of parameter values currently used by the compander and in replacement thereof a set of default parameter values optimized for fast adaptation, a Wait state that adjusts and monitors the adaptation coefficients until the adaptation coefficients are optimized, a Compute state that computes a calibration value for use in preventing gain runaway, a Save state that saves the optimized adaptation coefficients in the non-volatile memory device, and a Restore state that restores the set of parameters saved during the Override state.

13. An apparatus for controlling a gain of an audio signal broadcast by a loudspeaker into a room having ambient noise, comprising:

a first input for receiving the audio signal;

a second input for receiving an ambient room signal detected by a microphone the ambient room signal having a noise portion representing the ambient noise and an audio portion representing the audio signal;

an adaptive filter for adaptively filtering the audio signal to generate a filtered signal that approximates the audio portion of the ambient room signal, the adaptive filter having a plurality of adaptation coefficients that are modified according to a predetermined formula having a threshold for limiting the rate of variation of the adaptation coefficients;

an error signal generator for subtracting the filtered signal from the ambient room signal to generate an error signal;

a compander for adjusting the gain of the audio signal responsive of the error signal to compensate for the ambient noise;

wherein the compander adjusts the gain of the audio signal when the error signal is above a predetermined noise threshold level;

wherein the predetermined noise threshold level is defined by a user; and wherein the user-defined noise threshold is increased to a Noise Threshold Override value when the user-defined noise threshold is lower than the Noise Threshold Override value, wherein the Noise Threshold Override value is computed by:

$$\text{Noise Threshold Override}=\max [(GR/\max (CR, 1.0)+MaxG+\max (CG, CI)+CAL), NT]$$

where GR is representative of a gain range, CR is representative of a compression ratio between the gain range and a noise range, MaxG is representative of a maximum gain, CG is representative of a compander gate, CI is representative of a compander input level, CAL is representative of a calibration value, and NT is the user-defined noise threshold.

14. The apparatus of claim 13, wherein the calibration value CAL is computed by adding the RMS value of the error signal and the RMS value of a headroom signal, then minus the RMS value of the audio signal.

15. The apparatus of claim 14, wherein the RMS value of the headroom signal is calculated by taking the difference between the RMS values of the ambient room signal and the error signal, multiply the different with a first constant and then minus a second constant.

16. The apparatus of claim 15, wherein the first constant is approximately 0.6, and the second constant is approximately 3.0.

17. A method for controlling a gain of an audio signal broadcast by a loudspeaker into a room having ambient noise, comprising:

receiving the audio signal;

receiving an ambient room signal detected by a microphone, the ambient room signal having a noise portion representing, the ambient noise and an audio portion representing the audio signal;

adaptively filtering the audio signal to generate a filtered signal that approximates the audio portion of the ambient room signal, the adaptive filter using a plurality of adaptation coefficients that are modified according to a predetermined formula having a threshold for limiting the rate of variation of the adaptation coefficients;

using an error signal generator for subtracting the filtered signal from the ambient room signal to generate an error signal;

using a compander for adjusting the gain of the audio signal responsive of the error signal to compensate for the ambient noise;

down-sampling the audio signal at a sample rate lower than the highest frequency component of the audio signal, thereby generating a down-sampled audio signal, and adaptively filtering the down-sampled audio signal to generate the filtered signal; and updating the adaptation coefficients according to the formula $$Wi(n+1) = Wi(n) + \frac{\min[\text{beta}, e(n)] * u(n-i)}{\text{epsilon} * E(n)},$$

where $W_i(n)$ is representative of the i-th adaptation coefficient for the n-th audio sample, $e(n)$ is representative of the error signal, $u(n-i)$ is representative of the (n−i)th sample of the down-sampled audio signal, $E(n)$ is representative of the energy level of the audio signal, beta is the threshold value, and epsilon is a stability coefficient.

18. The method of claim 17, further comprising calculating $E(n)$ by generating a series of root-mean-square values of audio signal samples, and then filtering the series of root-mean-square values with a window function to generate a long term root-mean-square average to reduce the effect of sudden amplitude increase in the audio signal.

19. The method of claim 17, further comprising using the compander to determine a target gain level TG for the gain of the audio signal according to the formula TG=MinG+(GR*min [1.0, (e−NT)/NR]), where MinG is representative of a minimum gain level, GR is representative of a gain range, e is representative of the error signal level, NT is representative of a noise threshold, and NR is representative of a noise range level.

20. The method of claim 19, wherein the minimum gain level is approximately between −40 dB and 0 dB.

21. The method of claim 19, wherein the gain range is approximately between 0 dB and 40 dB.

22. The method of claim 19, wherein the noise threshold is approximately between −80 dB and 0 dB.

23. The method of claim 19, wherein the noise range is approximately between 1 dB and 60 dB.

24. The method of claim 19, further comprising using the compander to adjust the current gain applied to the music signal by increasing the current gain if the target gain is greater than the current gain.

25. The method of claim 24, further comprising determining the rate of increase in the current gain according to the formula current gain=current gain+a1/(Attack Time), where a1 is a predetermined constant, and Attack Time represents the amount of time for the current gain to increase by 40 dB.

26. The method of claim 19, further comprising using the compander to adjust the current gain applied to the music signal by decreasing the current gain if the target gain is less than the current gain.

27. The method of claim 26, wherein the rate of decrease in the current gain is responsive to a user-defined parameter Release Time and determined according to the formula current gain=current gain−a2/Release Time), where a2 is a predetermined constant, and Release Time represents the amount of time for the current gain to decrease by 40 dB.

28. A method for controlling a gain of an audio signal broadcast by a loudspeaker into a room having ambient noise, comprising:

receiving the audio signal;

receiving an ambient room signal detected by a microphone, the ambient room signal having a noise portion representing the ambient noise and an audio portion representing the audio signal;

adaptively filtering the audio signal to generate a filtered signal that approximates the audio portion of the ambient room signal, the adaptive filter using a plurality of adaptation coefficients that are modified according to a predetermined formula having a threshold for limiting the rate of variation of the adaptation coefficients;

using an error signal generator for subtracting the filtered signal from the ambient room signal to generate an error signal;

using a compander for adjusting the gain of the audio signal responsive of the error signal to compensate for the ambient noise;

storing parameters used by the adaptive filter in a non-volatile memory; and initially determining the adaptive coefficients according to a calibration procedure having an Override state that saves a set of parameter values currently used by the compander and in replacement thereof a set of default parameter values optimized for fast adaptation, a Wait state that adjusts and monitors the adaptation coefficients until the adaptation coefficients are optimized, a Compute state that computes a calibration value for use in preventing gain runaway, a Save state that saves the optimized adaptation coefficients in the non-volatile memory device, and a Restore state that restores the set of parameters saved during the Override state.

29. A method for controlling a Rain of an audio signal broadcast by a loudspeaker into a room having ambient noise, comprising:

receiving the audio signal;

receiving an ambient room signal detected by a microphone, the ambient room signal having a noise portion representing the ambient noise and an audio portion representing the audio signal;

adaptively filtering the audio signal to generate a filtered signal that approximates the audio portion of the ambient room signal, the adaptive filter using a plurality of adaptation coefficients that are modified according to a predetermined formula having a threshold for limiting the rate of variation of the adaptation coefficients;

using an error signal generator for subtracting the filtered signal from the ambient room signal to generate an error signal;

using a compander for adjusting the gain of the audio signal responsive of the error signal to compensate for the ambient noise;

wherein the compander adjusts the gain of the audio signal when the error signal is above a predetermined noise threshold level;

defining the predetermined noise threshold level by a user; and defining the user-defined noise threshold to a Noise Threshold Override value when the user-defined noise threshold is lower than the Noise Threshold Override value, wherein the Noise Threshold Override value is computed by:

$$\text{Noise Threshold Override} = \max\left[(GR/\max(CR, 1.0) + MaxG + \max(CG, CI) + CAL), NT\right]$$

where GR is representative of a gain range, CR is representative of a compression ratio between the gain range and a noise range, MaxG is representative of a maximum gain, CG is representative of a compander gate, CI is representative of a compander input level, CAL is representative of a calibration value, and NT is the user-defined noise threshold.

30. The method of claim 29, further comprising computing the calibration value CAL by adding the RMS value of the error signal and the RMS value of a headroom signal, then subtracting the RMS value of the audio signal.

31. The method of claim 30, further comprising calculating the RMS value of the headroom signal by taking the difference between the RMS values of the ambient room signal and the error signal, multiplying the difference with a first constant and then subtracting a second constant.

32. The method of claim 31, wherein the first constant is approximately 0.6, and the second constant is approximately 3.0.

* * * * *

UNITED STATES PATENT AND TRADEMARK OFFICE
CERTIFICATE OF CORRECTION

PATENT NO.       : 6,868,162 B1
APPLICATION NO.  : 09/715588
DATED            : March 15, 2005
INVENTOR(S)      : C. M. Jubien et al.

It is certified that error appears in the above-identified patent and that said Letters Patent is hereby corrected as shown below:

| COLUMN | LINE | ERROR |
|---|---|---|
| 4 | 43 | "256 RMS" should read --256 RMS-- |
| 4 | 48 | "256 RMS" should read --256 RMS-- |
| 8 | 7 | "with the rat least" should read --with the at least-- |
| 8 Equation 6 | 37 line 2 | "-3.0 Headroom *RMS*" should read -- -3.0=Headroom *RMS*-- |
| 8 Equation 7 | 41 line 1 | "*RMS*(Equ. 7)" should read --*RMS*     (Equ. 7)-- |
| 8 | 66 | "of 40dB." should read --of -40 dB.-- |
| 9 | 6 | "+10 dB" should read --±10 dB-- |
| 9 | 7-8 | "MG=-25dB" should break --MG= -25 dB-- |
| 9 | 47 | "scale I, signal" should read --scale signal-- |
| 9 | 49 | "(1.8*100" should read --(1.8*10^-- |
| 9 | 55 | "1.8V*10'" should read --1.8V*10^-- |
| 9 | 61 | "40 dB" should read -- -40 dB-- |
| 10 | 8 | "40 dB." should read -- -40 dB.-- |
| 10 | 26 | "-110 dB" should read -- -10 dB-- |
| 10 | 31 | "-100dB" should read -- -10 dB-- |
| 10 | 42 | "(60 dB" should read --(-60 dB-- |
| 11 | 48 | "2)button" should read --2) button-- |

UNITED STATES PATENT AND TRADEMARK OFFICE
CERTIFICATE OF CORRECTION

PATENT NO. : 6,868,162 B1 Page 2 of 2
APPLICATION NO. : 09/715588
DATED : March 15, 2005
INVENTOR(S) : C. M. Jubien et al.

It is certified that error appears in the above-identified patent and that said Letters Patent is hereby corrected as shown below:

| COLUMN | LINE | ERROR |
|---|---|---|
| 12 (Claim 1, | 28 line 19) | "rain" should read --gain-- |
| 12 (Claim 1, | 33 line 24) | "Generating" should read --generating-- |
| 14 (Claim 13, | 28 line 6) | "microphone the" should read --microphone, the-- |
| 15 (Claim 17, | 15 line 7) | "representing, the" should read --representing the-- |
| 16 (Claim 29, | 62 line 1) | "Rain" should read --gain-- |

Signed and Sealed this

Twenty-second Day of July, 2008

JON W. DUDAS
*Director of the United States Patent and Trademark Office*